(12) United States Patent
Sukurai

(10) Patent No.: US 8,264,427 B2
(45) Date of Patent: Sep. 11, 2012

(54) ELECTRO-OPTICAL DEVICE, AND ELECTRONIC APPARATUS

(75) Inventor: Kazunori Sukurai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 1247 days.

(21) Appl. No.: 11/812,341

(22) Filed: Jun. 18, 2007

(65) Prior Publication Data

US 2007/0268221 A1 Nov. 22, 2007

Related U.S. Application Data

(62) Division of application No. 10/913,433, filed on Aug. 9, 2004, now Pat. No. 7,248,238.

(30) Foreign Application Priority Data

Oct. 31, 2003 (JP) .................................. 2003-372592

(51) Int. Cl.
*G09G 3/30* (2006.01)

(52) U.S. Cl. ............................ 345/76; 345/45; 315/169.3

(58) Field of Classification Search .................... 345/76, 345/80, 45; 315/169.3
See application file for complete search history.

(56) References Cited

U.S. PATENT DOCUMENTS

| 6,366,025 | B1 * | 4/2002 | Yamada ..................... 315/169.3 |
| 6,583,775 | B1 | 6/2003 | Sekiya et al. |
| 6,894,671 | B2 | 5/2005 | Yamamoto et al. |
| 6,911,772 | B2 * | 6/2005 | Cok .............................. 313/501 |
| 2003/0090455 | A1 * | 5/2003 | Daly ............................. 345/102 |
| 2005/0093767 | A1 | 5/2005 | Lu et al. |
| 2005/0174510 | A1 * | 8/2005 | Yano et al. ...................... 349/98 |

FOREIGN PATENT DOCUMENTS

| JP | A-10-288980 | 10/1998 |
| JP | A-2001-184000 | 7/2001 |
| JP | A-2002-014366 | 1/2002 |
| JP | A-2003-150120 | 5/2003 |
| KR | 2005-2143 A | 1/2005 |
| TW | 1225627 B | 12/2004 |

* cited by examiner

*Primary Examiner* — Amare Mengistu
*Assistant Examiner* — Dmitriy Bolotin
(74) *Attorney, Agent, or Firm* — Oliff & Berridge, PLC

(57) ABSTRACT

Aspects of the invention provide an electro-optical device including first pixel portions each including an active element and second pixel portions each not including any active element, the first and second pixel portions being provided in an image display region of a substrate, a first driving device for driving the first pixel portions in an active driving method and a second driving device for driving the second pixel portions in a passive driving method. Accordingly, the invention can realize a display by using both an active driving method and a passive driving method with a simple structure.

5 Claims, 18 Drawing Sheets

ELECTRO-OPTICAL DEVICE, AND ELECTRONIC APPARATUS

This is a Divisional of application Ser. No. 10/913,433 filed Aug. 9, 2004, which in turn claims the benefit of Japanese Patent Application No. 2003-372592-256043, filed Oct. 31, 2003. The entire disclosure of the prior applications is hereby incorporated by reference herein in its entirety.

BACKGROUND OF THE INVENTION

1. Field of Invention

Aspects of the invention relate to an electro-optical device, such as an organic EL (electro-luminescence) panel, and a method of manufacturing the same, and to various electronic apparatuses equipped with the electro-optical device.

2. Description of Related Art

As a related method for driving electro-optical devices, an active driving method or a passive driving method is commonly used. See, for example, Japanese Unexamined Patent Application Publication No. 10-288980. The active driving method and the passive driving method are different from each other in that they are used in the electro-optical devices having different structures. As such, it is necessary to manufacture electro-optical devices corresponding to the respective driving method to be implemented.

For example, in a vehicle navigation device, an electro-optical device in which an image is displayed by an active matrix driving method can be used. Further, it is possible to make, for example, a meter in an instrument panel for a vehicle with an electro-optical device in which an image is displayed by a passive driving method. In this case, when the image display for navigation and the image display for the meter are performed by using the same electro-optical device, an electro-optical device for performing the active driving and an electro-optical device for performing the passive driving can typically be incorporated into one electro-optical device.

SUMMARY OF THE INVENTION

However, as described above, when an electro-optical device has a plurality of electro-optical devices each driven by different driving methods, its structure becomes complicated, and the number of processes required for manufacturing the electro-optical device is increased.

On the other hand, if an electro-optical device is not incorporated with an electro-optical device driven by a passive driving method, an image to be displayed is only realized by an electro-optical device driven by an active driving method. However, if the electro-optical device is incorporated with a passively driven electro-optical device, a portion of the electro-optical device is occupied by the passively driven electro-optical device which has the same structure as the actively driven electro-optical device. Because of the resulting structure, the manufacturing process for the electro-optical device becomes difficult and inefficient, which consequently lowers the manufacturing yield.

Aspects of the invention has been made in consideration of the above problems, and can provide an electro-optical device, such as an organic EL panel, that is capable of realizing a display by using both the active driving method and the passive driving method and a method of manufacturing the same, and to provide various electronic apparatuses equipped with the electro-optical device.

Aspects of the invention can provide an electro-optical device that can include first pixel portions each including an active element and second pixel portions each not including any active element, the first and second pixel portions being provided in an image display region on a substrate, a first driving device for driving the first pixel portions in an active driving method, and a second driving device for driving the second pixel portions in a passive driving method.

In the exemplary electro-optical device of the invention, the image display region on the substrate can include a first display region in which one or a plurality of first pixel portions is formed and a second display region in which one or a plurality of second pixel portions is formed. That is, the first pixel portions and the second pixel portions are formed on a common substrate.

The first driving device and the second driving device are respectively composed of, for example, an integrated circuit separately formed on a substrate. In addition, the integrated circuits each constituting the first driving device and the second driving device are outer-mounted or post-mounted, for example, on a peripheral region of the image display region on the substrate. Moreover, at least one of the first driving device and the second driving device may be built in the same substrate as the first pixel portions and the second pixel portions are formed on.

When the exemplary electro-optical device of the invention is driven, the first pixel portions are actively driven by the active elements in accordance with the first driving signal output from the first driving device. Moreover, the active elements are formed of semiconductor elements, such as thin film transistors (hereinafter, referred to as TFTs or thin film diodes (hereinafter, referred to as TFDs). Meanwhile, the second pixel portions are passively driven in accordance with the second driving signal output from the second driving device.

Accordingly, the first display region displays an image by an active driving method, and the second display region displays an image by a passive driving method. Thus, according to the exemplary electro-optical device of the invention, an image display region on a substrate may include the first display region in which an image is displayed by the active driving method and the second display region in which an image is displayed by the passive driving method. Therefore, compared to a case in which an electro-optical device driven by the active driving method and an electro-optical device driven by the passive driving method are separately provided, the electro-optical device of the invention can have a simple structure. Further, since the number of manufacturing processes is not increased, it is possible to efficiently manufacture an electro-optical device with high yield.

Further, it is possible to assign, to a first display region, a region in which the display of various images including moving pictures, such as images for a vehicle navigation is performed, and to assign, to a second display region, a region in which the display of a relatively simple image, such as the display for a vehicle meter or the display of time, is performed. The display of a simple image may be performed by the plurality of second pixel portions that are aligned in a segment arrangement, corresponding to the display.

Alternately, in both the first display region and the second display region, the display of a relatively simple image, such as the display of an image for the vehicle meter or the display of time may be performed, or the display of various images including moving pictures may be performed.

As described above, according to the exemplary electro-optical device of the invention, it is possible to design the first display region and the second display region in accordance with the display type of the image display region. Therefore, one of the first display region or the second display region that consumes a relatively large current for display may be limited to a necessary and minimum size, and thus the current consumption of the electro-optical device may be optimized.

In an aspect of the electro-optical device of the invention, the wiring lines corresponding to the first pixel portions and the second pixel portions are provided on the substrate, and a connecting electrode electrically connecting the corresponding wiring line to the active element is provided in each of the first pixel portions. According to the aspect, at the time of operation, the first driving signal is supplied to the first pixel portions via the wiring lines corresponding to the first pixel portions. Further, the second driving signal is supplied to the second pixel portions via the wiring lines corresponding to the second pixel portions.

In each of the first pixel portion, the corresponding wiring line and the active element are electrically connected to each other via the connecting electrode. Accordingly, in the manufacture of the electro-optical device of the present invention, it is possible to form the active elements by a transferring process as described below. If such a transcription process is adopted, the formation of the active elements performed by a large number of processes can be performed with only the transcription process. Thus, it is possible to manufacture an electro-optical device more efficiently.

In manufacturing the electro-optical device of the invention, the connecting electrodes are formed on the wiring board on which the wiring lines have already been formed. Then, the active elements are transcribed onto the wiring board so as to correspond to the connecting electrodes, thereby forming the active elements.

In another aspect of the invention, the first pixel portion and the second pixel portion each include a light-emitting element as a display element. According to the aspect, the light-emitting elements are composed of, for example, organic EL elements or LEDs (Light Emitting Diodes). If the light-emitting elements are composed of the organic EL elements, it is possible to form the light-emitting elements by means of a printing method, such as an inkjet method. Thus, it is possible to manufacture an electro-optical device more efficiently.

In still another aspect of the electro-optical device of the invention, the image display region can include a region in which the first pixel portions or the second pixel portions are aligned in a matrix arrangement, and a region in which they are aligned in a segment arrangement.

According to the aspect, in the image display region, the first pixel portions and the second pixel portions are aligned in the matrix arrangement and in the segment arrangement, respectively. In the image display region, a region in which the display of various images including moving pictures is performed is a matrix arrangement region, and a region in which the display of a relatively simple image, such as the display for a vehicle meter or the display of time, is performed is a segment arrangement region.

The first display region is preferably the matrix arrangement region. Further, the entire region of the second display region may be aligned in the segment arrangement, or a portion of the second display region may be aligned in the matrix arrangement. According to the aspect, as described above, the first pixel portions and the second pixel portions are aligned in the matrix arrangement or in the segment arrangement. Thus, it is possible to design the first display region and the second display region in accordance with the display type of the image display region. Further, if the first display region and the second display region are designed as described above, it is possible to optimize the current consumption of the electro-optical device.

In the aspect in which the image display region include the matrix arrangement region and the segment arrangement region, the first pixel portions are provided in the matrix arrangement region, and the second pixel portions are provided in the segment arrangement region. According to the structure, it is possible to assign the region in which the display of various images including moving pictures is performed to the first display region, and to assign the region in which the display of a relatively simple image, such as the display for the vehicle meter or the display of time, is performed to the second display region. Alternately, it is possible to perform the display of a relatively simple image, such as the display for the vehicle meter or the display of time, in both the first display region and the second display region.

In still another exemplary aspect of the electro-optical device of the present invention, both the first pixel portions and the second pixel portions can be aligned in the matrix arrangement. According to the aspect, in both the first display region and the second display region, it is possible to perform the display of various images. For example, in both the first display region and the second display region, it is possible to perform the display of a relatively simple image, such as the display for the vehicle meter or the display of time, and to perform the display of various images including moving pictures.

According to still another aspect of the electro-optical device of the invention, in the image display region, an image display for a vehicle instrument panel is performed in accordance with a first driving signal output from the first driving means and a second driving signal output from the second driving device. According to the aspect, it is possible to perform the display for the instrument panels designed for various means of transportation, such as a vehicle, an aircraft, and a train. For example, it is possible to perform the image display for the vehicle navigation and the display for the vehicle meter in the image display region.

In order to solve the problems, an electronic apparatus of the invention can include the electro-optical device according to any one of the above-mentioned aspects.

Since the electronic apparatus of the invention can include the electro-optical device of the invention described above, it displays an image using both the active driving method and the passive driving method with a simple structure. Various electronic apparatuses, such as a projective display device, a television, a cellular phone, an electronic organizer, a word processor, a view finder type or monitor-direct-view type videotape recorder, a workstation, a television telephone, a POS terminal, a touch panel may be realized. Further, as the electronic apparatus of the invention, it is possible to realize, for example, an electrophoresis device, such as an electronic paper, a field emission display, and a conduction electron-emitter display.

Aspects of the invention can provide a method of manufacturing an electro-optical device including the steps of partially transferring, onto connecting electrodes formed on a wiring board having a plurality of wiring lines, and first forming regions and second forming regions defined by the plurality of wiring lines, active elements formed on another substrate, the connecting electrodes being formed in the first forming regions so as to be connected to the wiring lines forming relay wiring lines connected to the plurality of wiring lines using a conductive material such that they correspond to the first forming regions and the second forming regions; and forming display elements which are connected to the relay wiring lines.

In the method of manufacturing the electro-optical device of the invention, on the wiring board, the first pixel portions are formed corresponding to the first forming regions, and the second pixel portions are formed corresponding to the second forming regions. In the first forming regions, for example, bumps are formed as electrodes for connecting the connecting electrodes and the corresponding wiring lines. The connecting electrodes are connected to the wiring lines via the bumps.

Here, on a surface of a glass substrate as another substrate, an exfoliating layer made of, for example, amorphous silicon is formed, and a plurality of active elements is formed on the exfoliating layer.

Subsequently, the surface of the wiring board on which the connecting electrodes are formed and the surface of the glass substrate on which the plurality of active elements is formed are aligned opposite to each other, and then laser beams are partially illuminated to a surface opposite to the surface of the glass substrate on which the plurality of active elements is formed, thereby transferring the active elements onto the connecting electrodes. In other words, some of the active elements formed on the glass substrate are partially transcribed onto the first forming regions, not onto the entire surface of the wiring board.

Next, after the relay wiring lines are formed, for example, by a printing method, display elements are formed so as to be connected to the relay wiring lines. The formation of the display elements may be performed by sequentially depositing and patterning various materials for forming the display elements on the wiring board, or by forming the display elements on a separate substrate and by bonding the substrate to the wiring board to be aligned with each other.

Therefore, according to the method of manufacturing the electro-optical device of the invention, the first pixel portions that are driven in the active driving method and the second pixel portions that are driven in the passive driving method can be formed on the common wiring board. Thus, compared to a case in which an electro-optical device driven by the active driving method and an electro-optical device driven by the passive driving method are separately provided, it can be possible to manufacture an electro-optical device having a simple structure. In addition, since the number of manufacturing processes is not increased, it is possible to efficiently manufacture an electro-optical device with high yield.

Further, the formation of the active element that is performed through a large number of processes can be performed separately from the manufacturing process of the electro-optical device. Regardless of forming the active elements on a portion of or the entire the surface of the glass substrate, it is possible to transcribe the active elements onto the wiring board. Further, the glass substrate may have a size that is not subjected to the size of the wiring board. Therefore, if the active elements are formed on a glass substrate, it is possible to manufacture a plurality of electro-optical devices by partially transferring the active elements on the glass substrate to the wiring board. Thus, according to such a transcription step, it is possible to manufacture an electro-optical device more efficiently.

Moreover, the active elements and a plurality of or a number of unit circuits including the active elements may be formed on the glass substrate, and then a transcription step may be partially performed on each unit circuit.

The method of manufacturing the electro-optical device of the invention can further include, after the step of transferring the active elements and before the step of forming the display elements, a step of forming an interlayer insulating film on an upper portion of the active elements, and a step of planarizing the interlayer insulating film.

According to the aspect, it is possible to planarize an uneven portion formed on a surface of the interlayer insulating film in accordance with the shape of the active elements that are formed by the transcription step. In addition, it is possible to form the display elements by sequentially depositing various materials for forming the display elements on the smoothed interlayer insulating film.

According to another aspect of the method of manufacturing the electro-optical device of the invention, in the step of forming the display elements, light-emitting elements are formed as the display elements. In the aspect, if the light-emitting elements are composed of organic EL elements or LEDs, it is possible to form the light-emitting elements by a printing method, such as an inkjet method. Thus, it is possible to manufacture an electro-optical device more efficiently.

The advantages and benefits of the invention will be apparent from the following exemplary embodiments.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Hereinafter, exemplary embodiments of the invention will be described with reference to the accompanying drawings. To begin with, the schematic structure of an electro-optical device will be described with reference to FIG. 1. Here, FIG. 1 is an exemplary block diagram showing the entire structure of the electro-optical device according to the exemplary embodiment.

Figure 1:
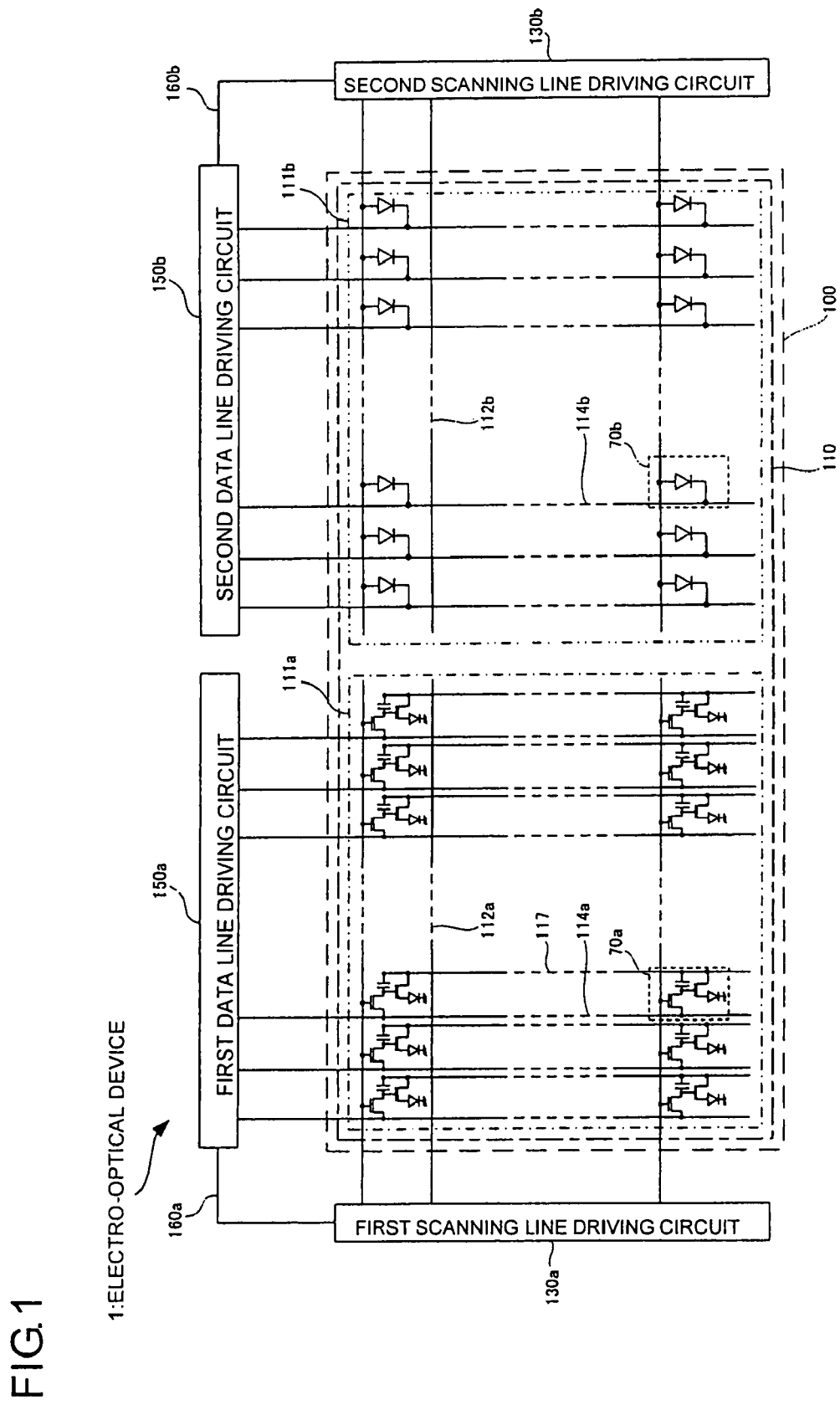
FIG. 1 is an exemplary block diagram showing the entire structure of an electro-optical device.

As shown in FIG. 1, an electro-optical device 1 can include, as the main parts, an organic EL panel 100, a first scanning line driving circuit 130a, a first data line driving circuit 150a, a second scanning line driving circuit 130b, and a second data line driving circuit 150b. In the exemplary embodiment, an example of a first driving device according to the invention includes the first scanning line driving circuit 130a and the first data line driving circuit 150a, and an example of a second driving device according to the invention can include the second scanning line driving circuit 130b and the second data line driving circuit 150b.

In the organic EL panel 100, an image display region 110 can include a first display region 111a and a second display region 111b. In the first display region 111a, first data lines 114a and first scanning lines 112a are provided vertically and horizontally, and first pixel portions 70a corresponding to the intersections therebetween are arranged in a matrix. Further, in the first display region 111a, current supply lines 117 which correspond to the first pixel portions 70a with respect to the first data lines 114a are provided.

Further, in the second display region 111b, second pixel portions 70b which correspond to the intersections between the second data lines 114b and the second scanning lines 112b are arranged in a matrix.

Figure 2A:
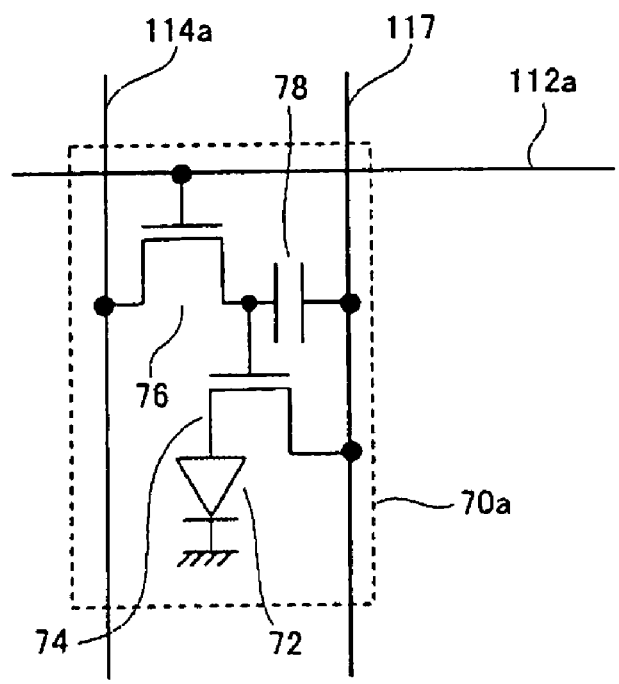
FIG. 2(a) is a circuit diagram showing a circuit structure of a first pixel portion.
Figure 2B:
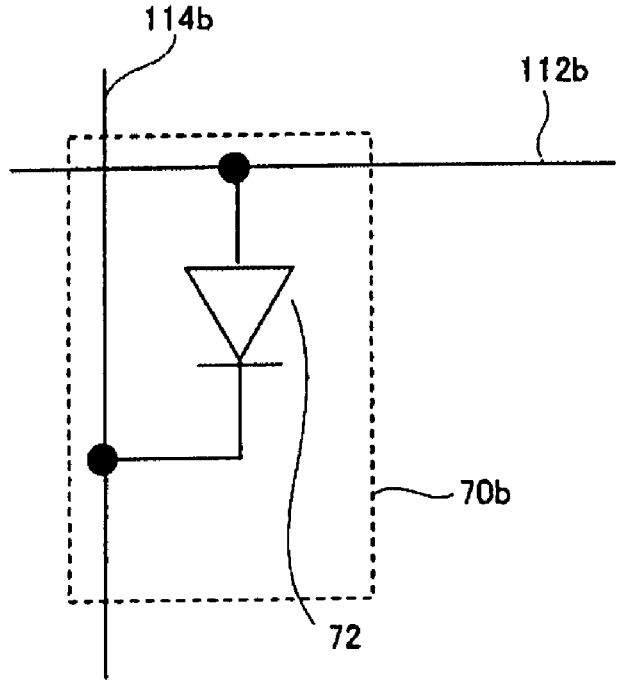
FIG. 2(b) is a circuit diagram showing a circuit structure of a second pixel portion.
Figure 3:
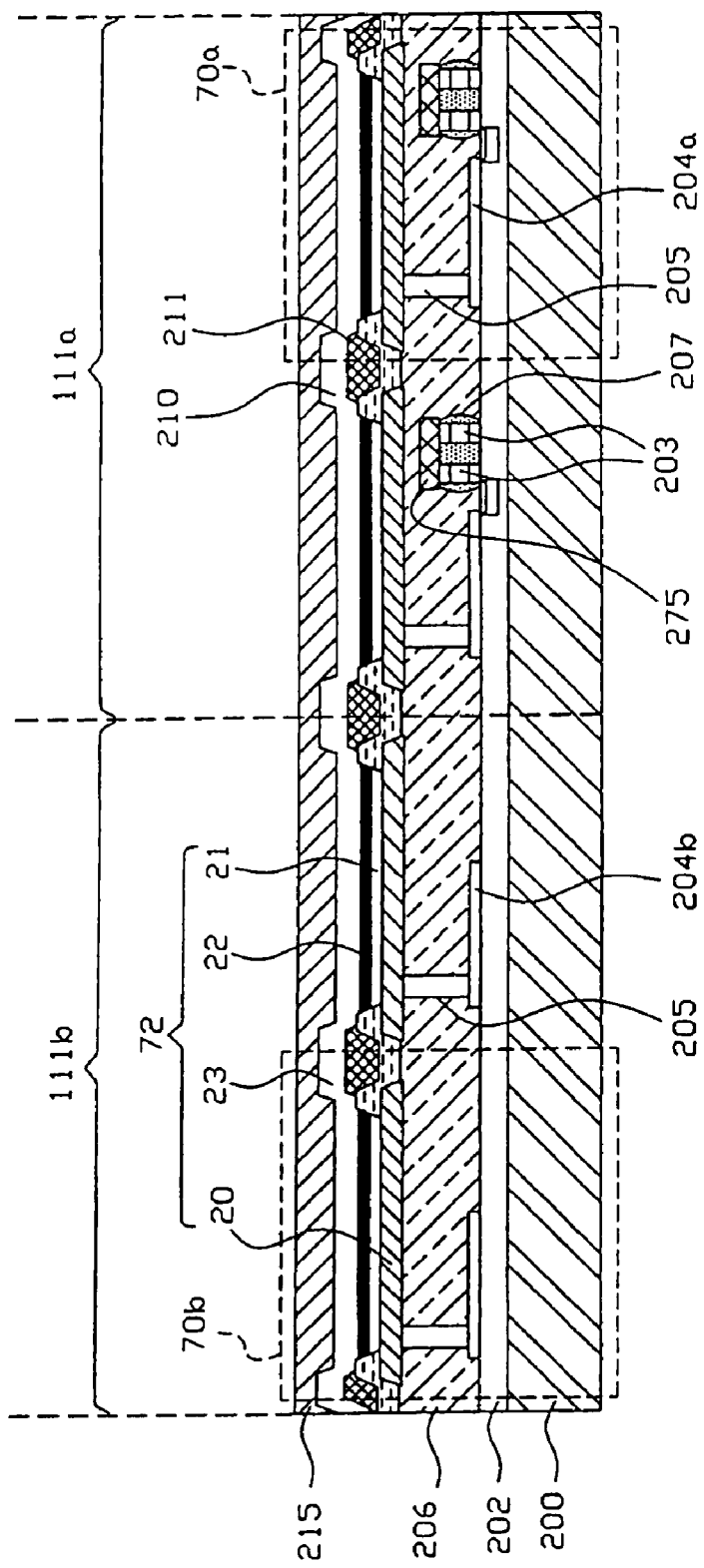
FIG. 3 is a cross-sectional view showing a sectional structure of an organic EL panel.

Next, the structure of the first pixel portions 70a and the second pixel portions 70b will be described with reference to FIGS. 2 and 3. FIG. 2(a) is an exemplary circuit diagram showing the circuit structure of the first pixel portion 70a, and FIG. 2(b) is an exemplary circuit diagram showing the circuit structure of the second pixel portion 70b. FIG. 3 is a cross-sectional view illustrating the sectional structure of the vicinity of the boundary of the first display region 111a and the second display region 111b in the organic EL panel 100.

In FIG. 2(a), in the first pixel portion 70a, a switching transistor 76 and a driving transistor 74 in which a TFT is used for an active element according to the invention, a storage capacitor 78, and an organic EL element 72 as a display element according to the invention are provided.

The first scanning line 112a is electrically connected to a gate electrode of the switching transistor 76. The first data line 114a is electrically connected to a source electrode of the switching transistor 76. A gate electrode of the driving transistor 74 is electrically connected to a drain electrode of the switching transistor 76. Further, the current supply line 117 is electrically connected to a source electrode of the driving transistor 74, and the organic EL element 72 is electrically connected to a drain electrode of the driving transistor 74.

In the second pixel portion 70b shown in FIG. 2(b), the organic EL element 72 is electrically connected to the second scanning line 112b and the second data line 114b. An active element is not provided in the second pixel portion 70b.

In the exemplary embodiment, a plurality of the first pixel portions 70a and a plurality of the second pixel portions 70b are formed on a common wiring board 200. In FIG. 3, the portions boxed with a dotted line represent regions for one of the first pixel portions 70a in the first display region 111a and one of the second pixel portions 70b in the second display region 111b, respectively. The wiring board 200 is made of, for example, a glass substrate, and an insulating layer 202 made of acrylic resin is deposited on the wiring board 200. In the first display region 111a, a plurality of first wiring lines 204a is formed on the insulating layer 202, each being made of a conductive film, such as aluminum (Al).

The plurality of first wiring lines 204a includes the plurality of scanning lines 112a and the plurality of data lines 114a shown in FIG. 1. In addition, a plurality of connecting electrodes 207 are provided corresponding to the intersections between the plurality of scanning lines 112a and the plurality of data lines 114a. Each connecting electrode 207 is preferably connected to the corresponding first wiring line 204a, and is made of a conductive paste coated onto a bump 203 which can be formed by plating a metal material including electroless nickel (Ni) and gold (Au).

A plurality of unit circuits 275 is formed in the plurality of connecting electrodes 207. Each unit circuit 275 includes the switching transistor 76 and the driving transistor 74, functioning as an active element, and a storage capacitor 78.

Furthermore, in the second display region 111b, a plurality of second wiring lines 204b is formed on the insulating layer 202, for example, using the same conductive film as that of the plurality of first wiring lines 204a. The plurality of second wiring lines 204b includes the plurality of second scanning lines 112b and the plurality of second data lines 114b shown in FIG. 1.

In addition, on the plurality of first wiring line 204a, the plurality of unit circuits 275, and the plurality of second wiring lines 204b, an interlayer insulating film 206 made of, for example, acrylic resin is deposited ranging from the first display region 111a to the second display region 111b. In the interlayer insulating film 206, a plurality of relay electrodes 205 made of a conductive material including, for example, silver (Ag) is formed to pass through the interlayer insulating film 206 in the normal direction of the wiring board 200. The plurality of relay electrodes 205 is provided such that their one ends are connected to the first wiring lines 204a and the second wiring lines 204b.

On the interlayer insulating film 206, the regions in which the plurality of first pixel portions 70a are formed and the regions in which the plurality of second pixel portions 70b are formed are defined by a protective film 211 and a bank 210. The protective film 211 is made of a suitable material, such as a silicon oxide film, and the bank 210 is made of a suitable material, such as acrylic resin. The plurality of the defined regions correspond to a plurality of first forming regions defined by the plurality of first wiring lines 204a in the first display region 111a, and to a plurality of second forming regions defined by the plurality of second wiring lines 204b in the second display region 111b.

In addition, in the plurality of regions defined by the protective film 211 and the bank 210, a plurality of organic EL elements 72 is formed. More specifically, the organic EL element 72 includes an anode 20 made of a material including, for example, aluminum (Al), a cathode 23 formed of preferably an ITO (Indium Tin Oxide) film, and an organic EL layer of a light-emitting layer 21 and a hole-injecting layer 22 interposed between the anode 20 and the cathode 23. In the plurality of organic EL elements 72, the anode 20 is connected to the other end of the relay electrode 205. Further, the plurality of organic EL elements 72 are sealed by a transparent sealing layer 215. Moreover, in the organic EL element, the structure of the organic EL layer is not limited to a two-layered structure including the light-emitting layer 21 and the hole injecting layer 22 as shown in FIG. 3, but it may be a single-layered structure or a multi-layered structure including three layers or more. With such a structure, it is possible to advance luminous efficiency.

Returning to FIG. 1, the first scanning line driving circuit 130a, the first data line driving circuit 150a, the second scanning line driving circuit 130b, and the second data line driving circuit 150b can be built separately or together in a separate substrate from the wiring board 200, and are outer-mounted or post-mounted on the peripheral region of the image display region 110 on the wiring board 200. Also, the first scanning line driving circuit 130a, the first data line driving circuit 150a, the second scanning line driving circuit 130b, and the second data line driving circuit 150b may be built at least partially in the peripheral region of the wiring board 200.

The first scanning line driving circuit 130a sequentially supplies a first scanning signal as a first driving signal with the first scanning lines 112a provided in the first display region 111a to sequentially activate the first scanning lines 112a. Further, the first data line driving circuit 150a supplies a first image signal as a first driving signal with the first data lines 114a provided in the first display region 111a.

Further, with the second scanning lines 112b provided in the second display region 111b, a second scan signal is sequentially supplied as a second driving signal by the second scanning line driving circuit 130b. Furthermore, with the second data lines 114b provided in the second display region 111b, a second image signal is supplied as a second driving signal of the second data line driving circuit 150b.

Moreover, the operation of the first scanning line driving circuit 130a and the operation of the first data line driving circuit 150a will be synchronized with each other by a first synchronization signal 160a. Further, the operation of the second scanning line driving circuit 130b and the operation of the second data line driving circuit 150b will be synchronized with each other by a second synchronization signal 160b. In addition, a signal for the synchronization between the first scanning line driving circuit 130a and the first data line driving circuit 150a, and the second scanning line driving circuit 130b and the second data line driving circuit 150b may be supplied to each circuit.

According to the exemplary embodiment, in the first display region 111a, each pixel portion 70a is actively driven based on the first scanning signal and the first image signal as described below. Further, in the second display region 111b, each pixel portion 70b is passively driven based on the second scanning signal and the second image signal as described below. Therefore, the first display region 111a displays an image by an active driving method, and the second display region 111b displays an image by means of a passive driving method. Thus, the electro-optical device 1 can be configured to have the first display region 111a in which an image is displayed in the active driving method and the second display region 111b in which an image is displayed in the passive driving method. Therefore, compared to a case in which an electro-optical device in which an active driving method is performed and an electro-optical device in which a passive driving method is performed are incorporated individually, the electro-optical device 1 can be configured in a simple structure.

Figure 4:
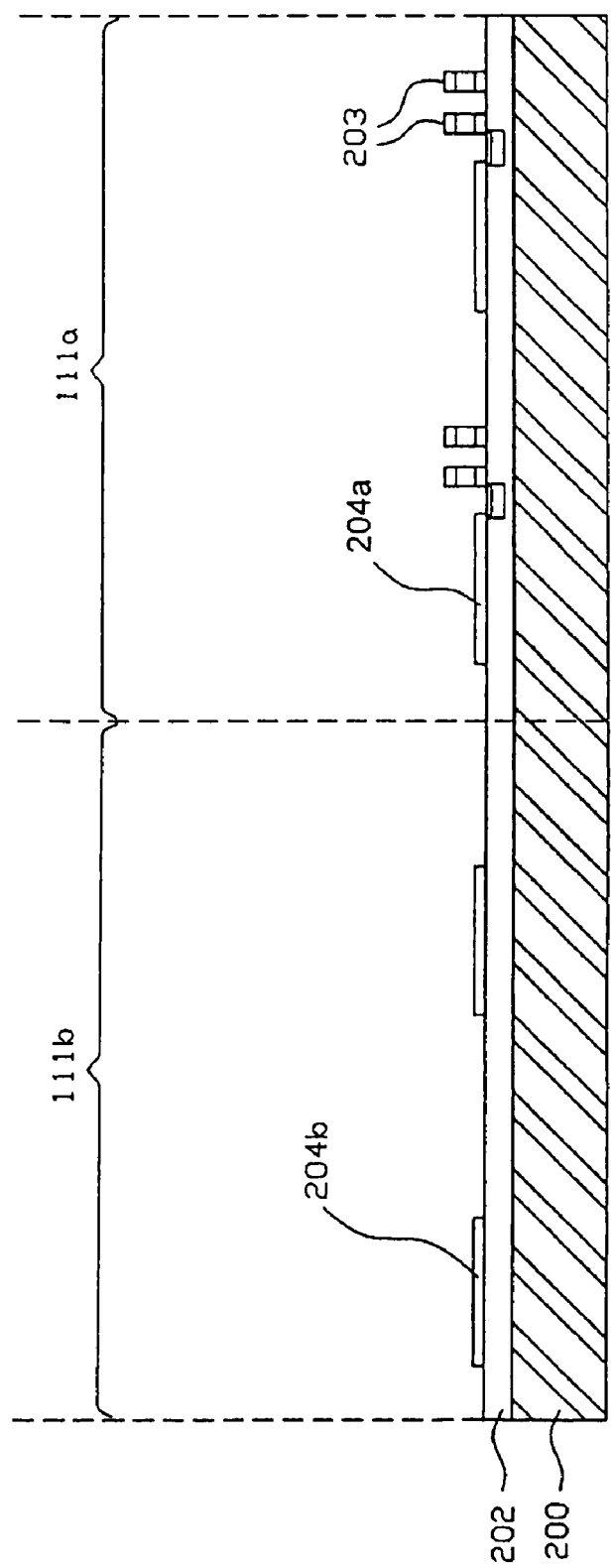
FIG. 4 is a view showing a sectional structure of a wiring board corresponding to FIG. 3.
Figure 5:
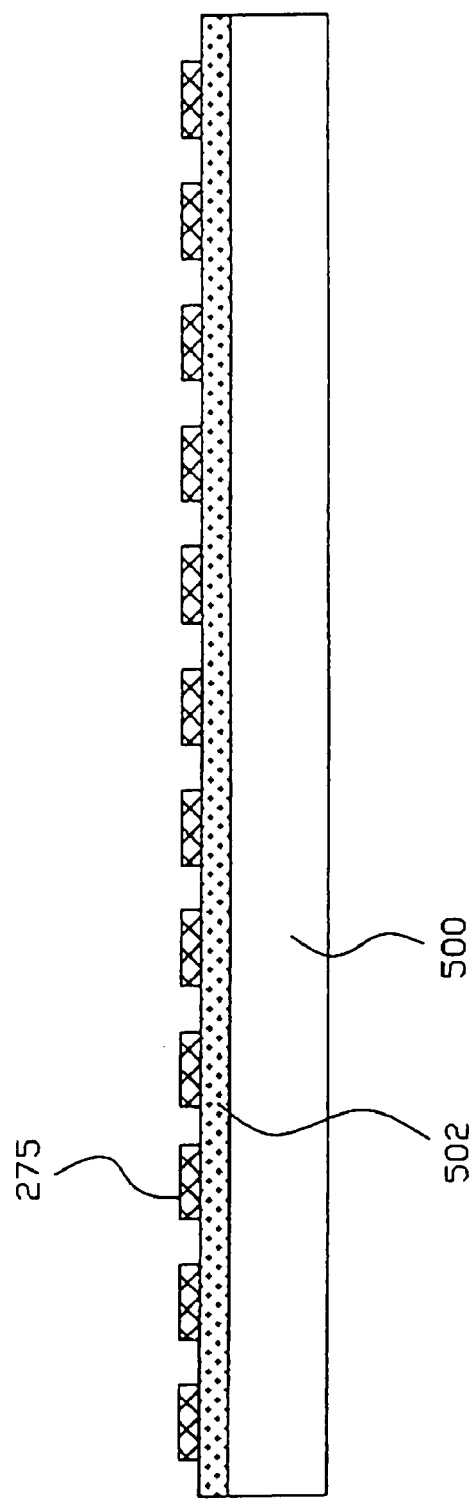
FIG. 5 is a cross-sectional view showing a structure of another board used for the transcription of a unit circuit.
Figure 11:
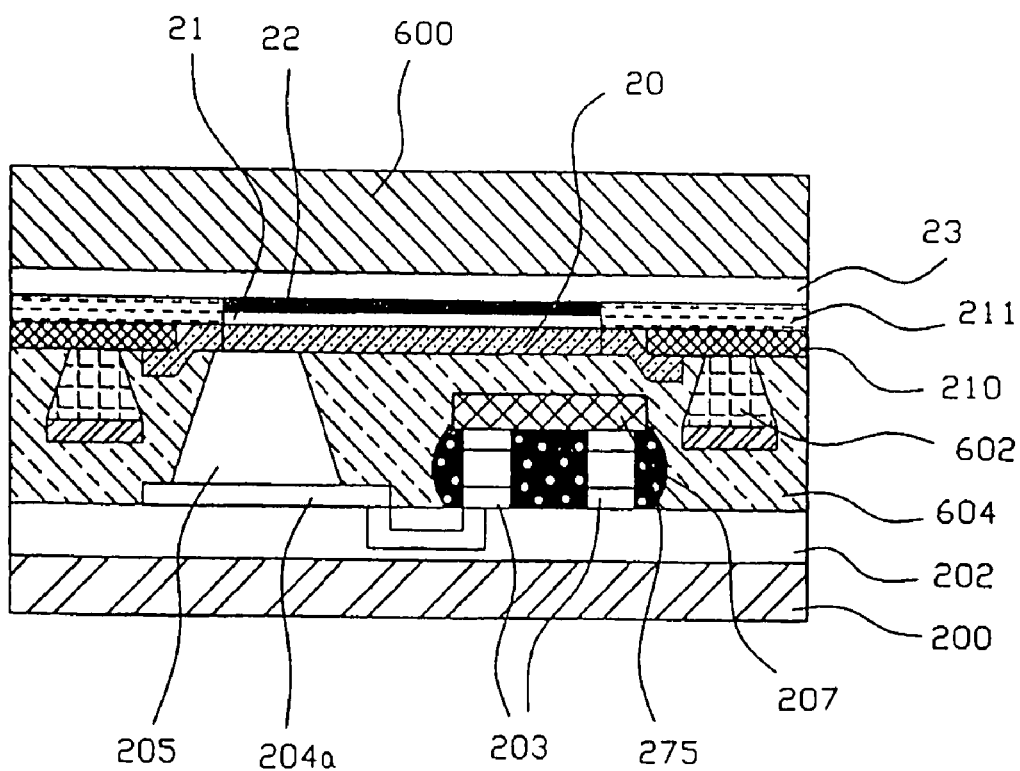
FIG. 11 is a cross-sectional view illustrating the formation of an organic EL element.

Next, a manufacturing process of the above electro-optical device 1 will be described with reference to FIGS. 4 to 10. Here, FIG. 4 shows the structure of a cross section corresponding to the wiring board of FIG. 3 in the beginning of the manufacturing process of the electro-optical device 1. FIG. 5 is a cross-sectional view showing the structure of another substrate used for the transcription of the unit circuit 275. In addition, FIGS. 6 to 10 are process diagrams sequentially showing the structure of cross sections corresponding to FIG. 3 in each process of the manufacturing processes. FIG. 11 is a cross-sectional view illustrating the formation of the organic EL element 72.

In FIG. 4, the insulating layer 202, the plurality of first wiring lines 204a, and the plurality of second wiring lines 204b are formed on the wiring board 200 are formed in advance on the wiring board 200 in manufacturing the electro-optical device 1. In this state, in the first display region 111a on the wiring board 200, the plurality of first forming regions are defined by the plurality of first wiring lines 204a, and the bump 203 is formed in each forming region. As a connecting electrode 207, a conductive paste is coated on each bump 203. The coating of the conductive paste is preferably performed using a printing method. Moreover, instead of the bump 203, a planar electrode may be provided. As the connecting electrode 207, conductive particles may be formed on the planar electrode. Further, in the second display region 111b on the wiring board 200, the plurality of second forming regions is defined by the plurality of second wiring lines 204b.

Furthermore, in FIG. 5, a glass substrate is used as another substrate 500 in manufacturing the electro-optical device 1. An exfoliating layer 502 made of, for example, amorphous silicon is formed on a surface of the substrate, and the plurality of unit circuits 275 is formed on the exfoliating layer 502. Here, the unit circuits 275 may be formed on the entire surface of the substrate 500, or may be formed partially thereon. Further, the size of the substrate 500 is not limited to that of the wiring board 200. Therefore, the substrate 500 having a size smaller or larger than that of the wiring board 200 in plan view may be used.

Figure 6:
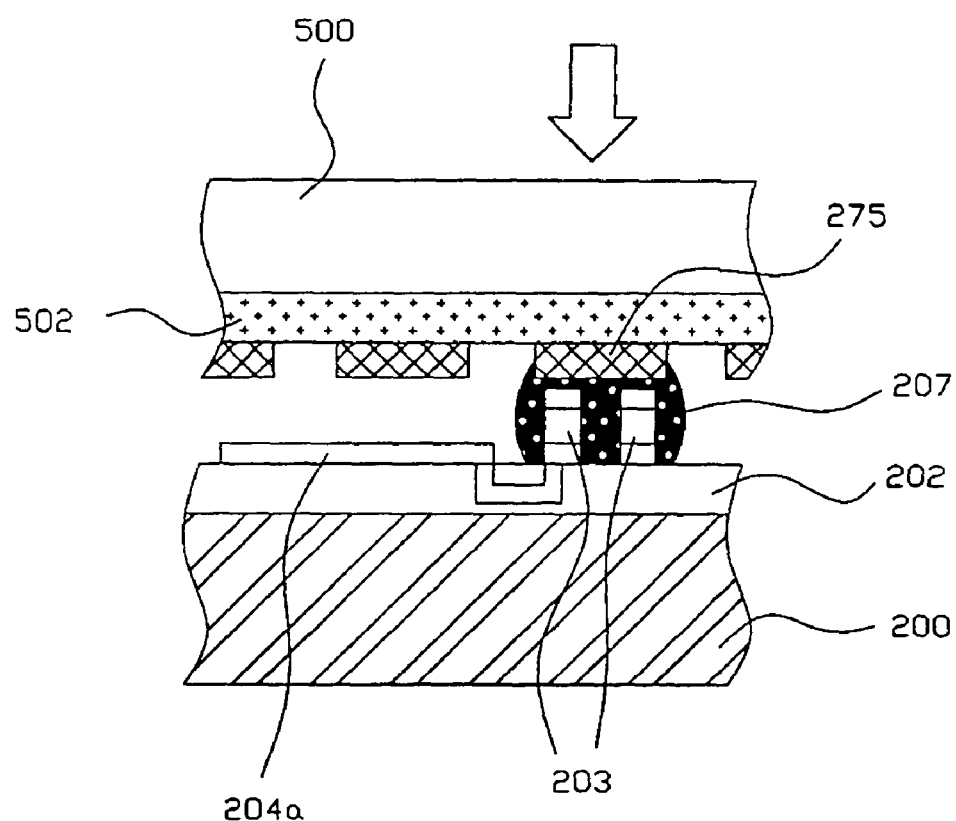
FIG. 6 is a cross-sectional view of a first process of manufacturing processes sequentially showing a method of manufacturing the electro-optical device.

For the manufacture of the electro-optical device 1, to begin with, in a process of FIG. 6, the unit circuits 275 on the substrate 500 shown in FIG. 5 are transcribed partially onto each of the plurality of connecting electrode 207. In FIG. 6, one of the first forming regions defined on the wiring board 200 is shown. A surface of the wiring board 200 on which the plurality of connecting electrodes 207 is formed and a surface of the substrate 500 on which the plurality of unit circuits 275 is formed are aligned opposite to each other. Then, laser beams are emitted in the arrow direction of FIG. 6, that is, onto the surface opposite to the side of the substrate 500 on which the unit circuits 275 are formed. The laser beams are emitted only onto the unit circuit 275 to be transcribed onto the wiring board 200 among the unit circuits 275 formed on the substrate 500.

Figure 7:
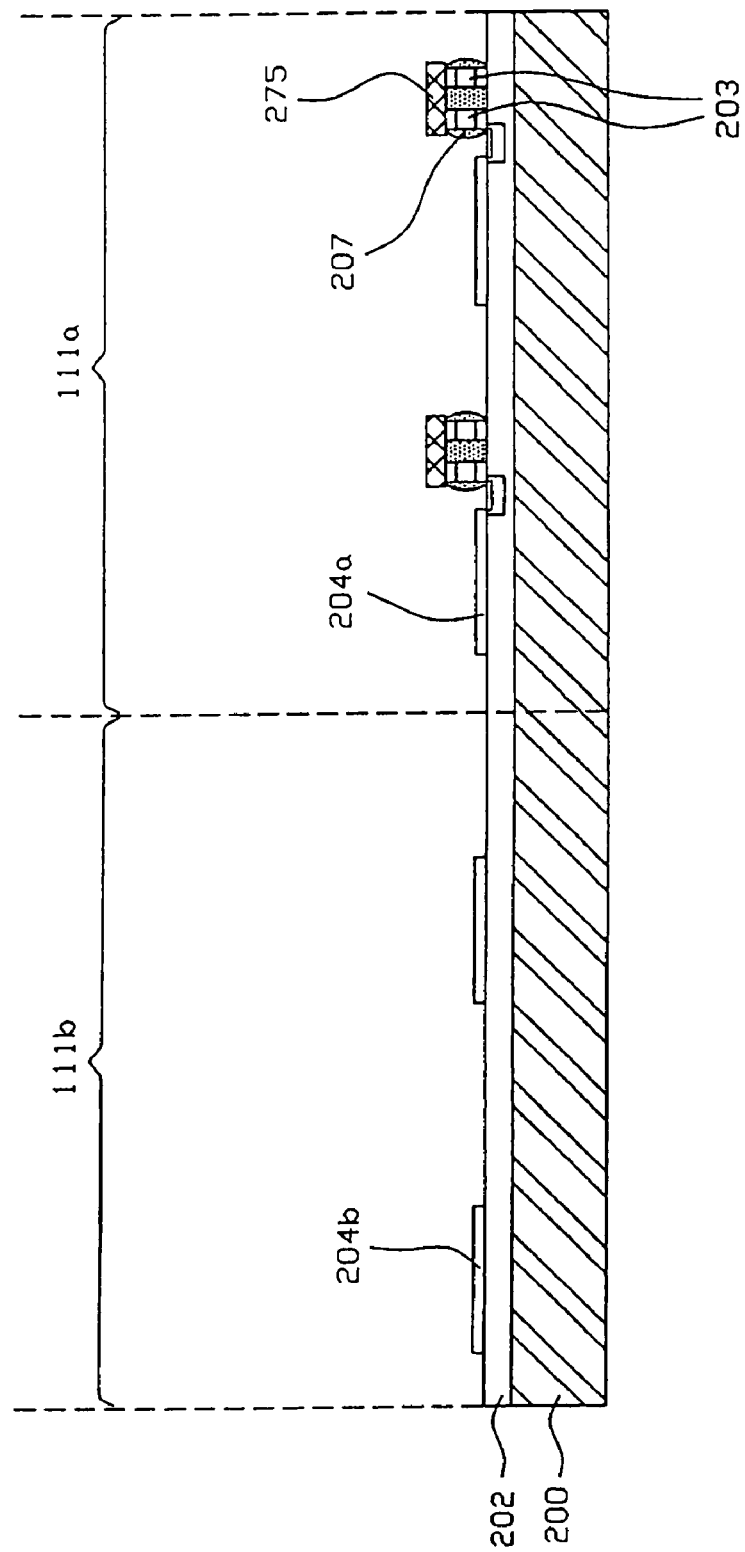
FIG. 7 is a cross-sectional view showing a structure of the wiring board after the transcription process.

After the process of FIG. 6, the unit circuit 275 is transcribed onto each of the plurality of connecting electrodes 207 on the wiring board 200 as shown in FIG. 7. That is, some of the unit circuits 275 formed on the substrate 500 are partially transcribed onto the plurality of first forming regions, not onto the entire upper surface of the wiring board 200.

Figure 8:
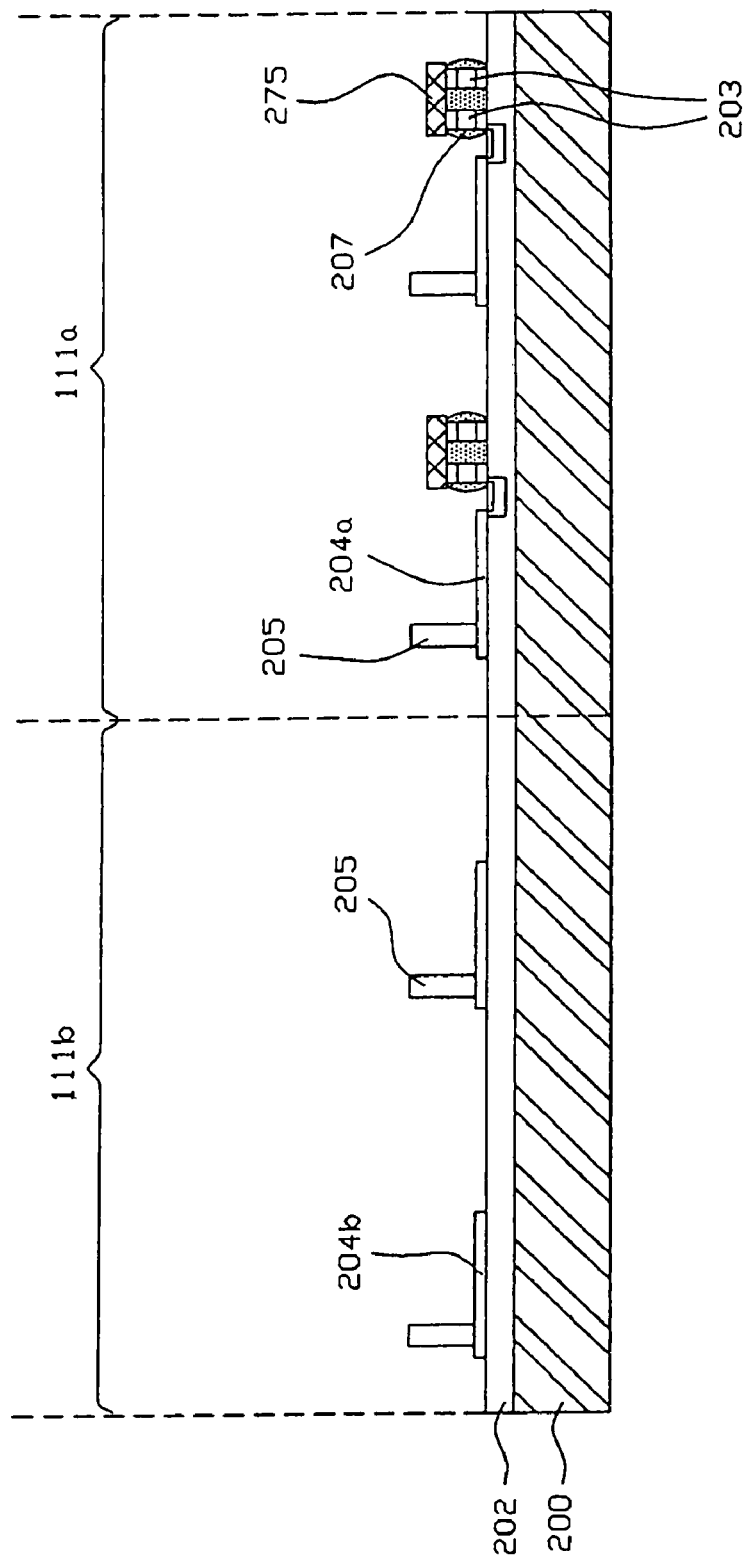
FIG. 8 is a cross-sectional view of a second process of the manufacturing processes sequentially showing the method of manufacturing the electro-optical device.

Subsequently, in the process of FIG. 8, the formation of the plurality of relay electrodes 205 can be performed by a printing method. Then, in the process of FIG. 9, a precursory film 206a of the interlayer insulating film 206 is formed by filling up the plurality of first wiring lines 204a, the plurality of unit circuits 275, the plurality of second wiring lines 204b, and the plurality of relay electrodes 205 that are formed on the wiring board 200. The precursory film 206a is formed ranging from the first display region 111a to the second display region 111b on the upper surface of the wiring board 200. Moreover, the formation of the precursory film 206a is performed by means of a known method.

Figure 9:
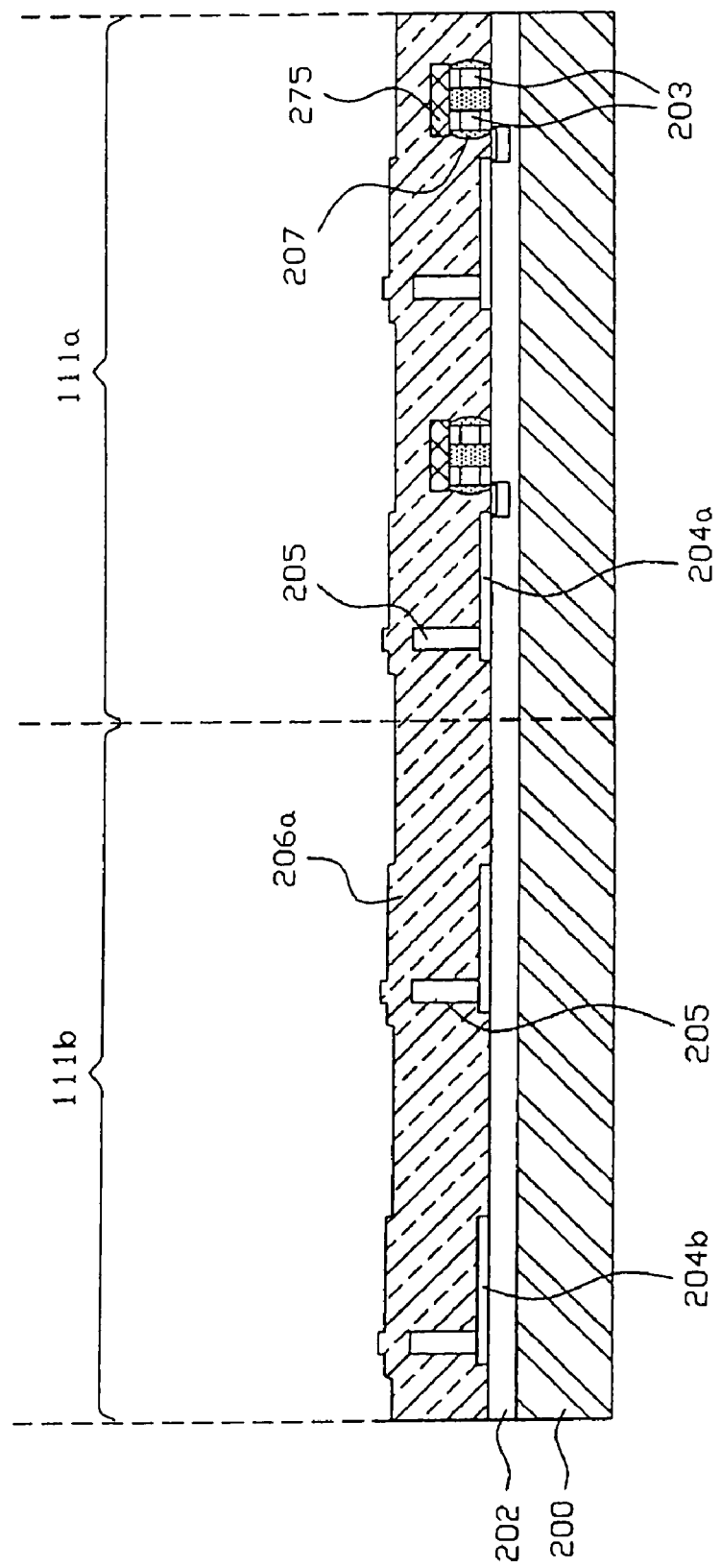
FIG. 9 is a cross-sectional view of a third process of the manufacturing processes sequentially showing the method of manufacturing the electro-optical device.
Figure 10:
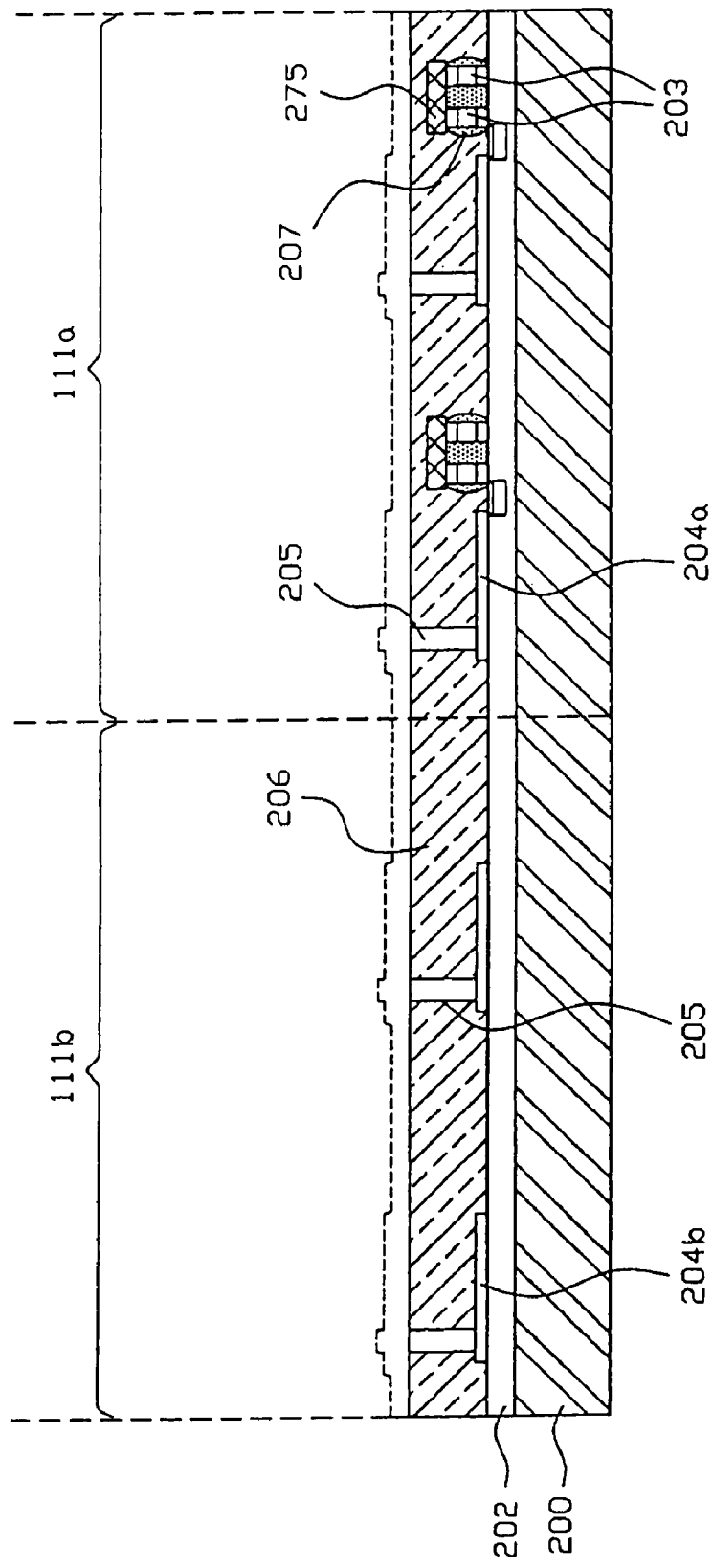
FIG. 10 is a cross-sectional view of a fourth process of the manufacturing processes sequentially showing the method of manufacturing the electro-optical device.

As shown in FIG. 9, an uneven portion is formed on the surface of the precursory film 206a, corresponding to the shapes of the plurality of first wiring lines 204a, the plurality of unit circuits 275, the plurality of second wiring lines 204b, and the plurality of relay electrodes 205. Subsequently, in the process of FIG. 10, a planarizing process is performed on the surface of the precursory film 206a by, for example, a chemical mechanical polishing (CMP) process to planarize the surface of the precursory film 206a, thereby forming the interlayer insulating film 206.

Next, a protective film 211, a bank 210, and a plurality of organic EL elements 72 are formed on the planarized interlayer insulating film 206. These components are preferably formed by depositing various materials on the interlayer insulating film 206 using a known method and by patterning them. Preferably, in the formation of the plurality of organic EL elements 72, a plurality of anodes 20 are formed by forming a thin film made of a material including aluminum on the surface of the interlayer insulating film 206 using a vapor depositing method or a sputtering method, and by patterning the thin film by mean of a photolithography method. Subsequently, after forming the protective film 211 and the bank 210, a light-emitting layer 21 and a hole injecting layer 22 are formed by a printing method, such as an inkjet method.

Here, FIG. 11 specifically shows the structure of the first forming region. As shown in FIG. 11, in manufacturing the electro-optical device 1, a cathode 23, a protective film 211, and banks 210 may be formed on a transparent substrate, such as a glass substrate, as a separate substrate 600 from the wiring board 200, and a light-emitting layer 21 and a hole injecting layer 22 that constitute an organic EL layer, and an anode 20 may be formed in each of a plurality of regions defined by the protective film 211 and the banks 210. Then, by aligning the substrate 600 on which the organic EL elements 72 are formed with the wiring board 200 on which the plurality of first wiring lines 204a, the plurality of unit circuits 275, the plurality of second wiring lines 204b, which are not shown in FIG. 11, and the plurality of relay electrodes 205, and by bonding them by means of a sealing resin 604, the electro-optical device 1 may be manufactured.

Moreover, in FIG. 11, a cathode separator 602 may be formed on the substrate 600, corresponding to the protective film 211 and the banks 210, and the anodes 20 may be formed of a material including aluminum (Al) by a vapor depositing method or a sputtering method. According to this method, the anodes 20 can be patterned without using a photolithography method.

Therefore, according to the exemplary embodiment, the plurality of first pixel portions 70a which is driven in the active driving method and the plurality of second pixel portions 70b which is driven in the passive driving method can be formed on the common wiring board 200. Thus, as compared with a case that an electro-optical device in which the active driving method is performed and an electro-optical device in which the passive driving method is performed are separately incorporated, it is possible to efficiently manufacture the electro-optical device 1 with high yield since the number of the manufacturing processes of the electro-optical device 1 is not increased.

Further, if the unit circuits 275 are formed on the substrate 500 as shown in FIG. 5, the formation of the switching transistor 76 and the driving transistor 74, and the storage capacitor 78 which are formed in a large number of processes can be performed separately from the manufacturing process of the electro-optical device 1. In addition, as described in the process of FIG. 6, by partially transferring the unit circuits 275 from the substrate 500, a plurality of electro-optical devices can be manufactured using the substrate 500. Therefore, it is possible to manufacture the electro-optical device more efficiently.

Moreover, in FIG. 5, instead of forming all components constituting each unit circuit 275, some components constituting each unit circuit 275, for example, both or one of the switching transistor 76 and the driving transistor 74, functioning as the active element, may be formed on the substrate 500, and other circuit elements or wiring lines constituting the first pixel portions 70a may be formed on the wiring board 200. Then, the active elements formed on the substrate 500 may be transcribed onto the wiring board 200.

Figure 12A:
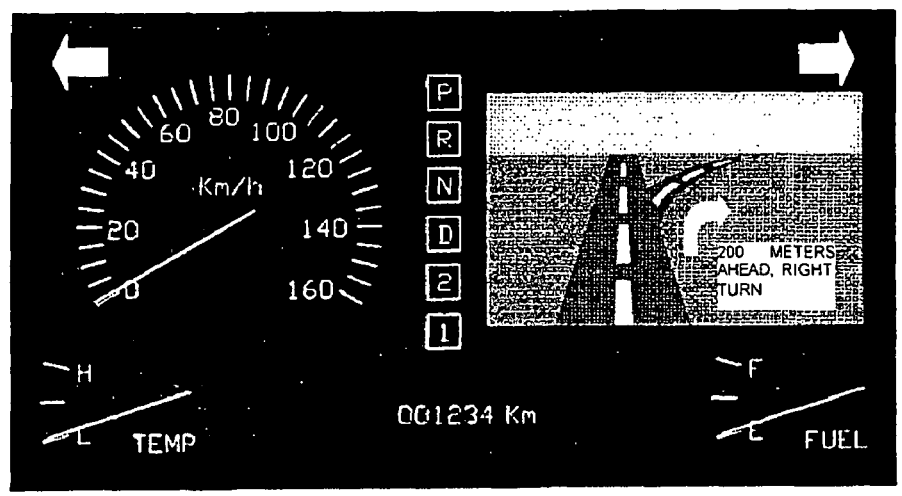
FIG. 12(a) shows an example of an image to be displayed.
Figure 12B:
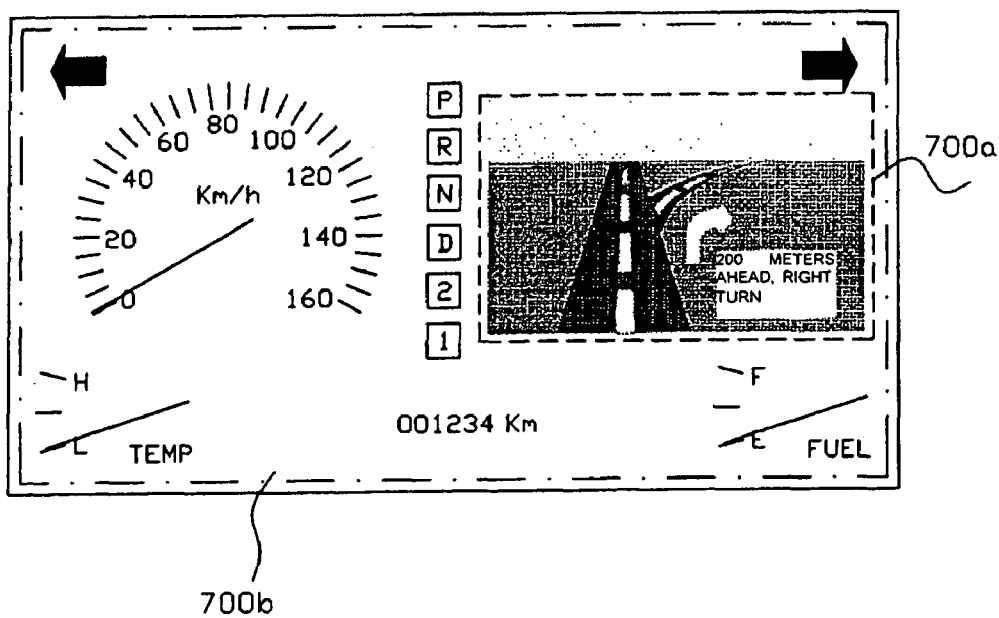
FIG. 12(b) is an explanatory view regarding a structure of an image display region in which the image of FIG. 12(a) is displayed.
Figure 13A:
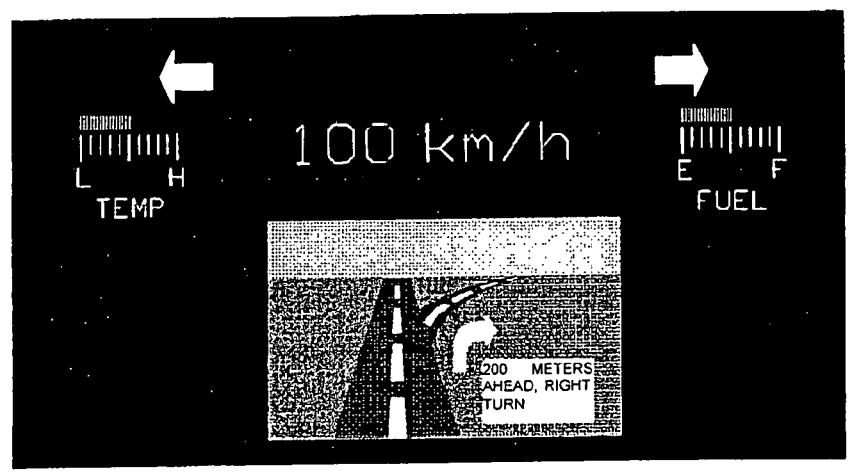
FIG. 13(a) shows another example of an image to be displayed.
Figure 13B:
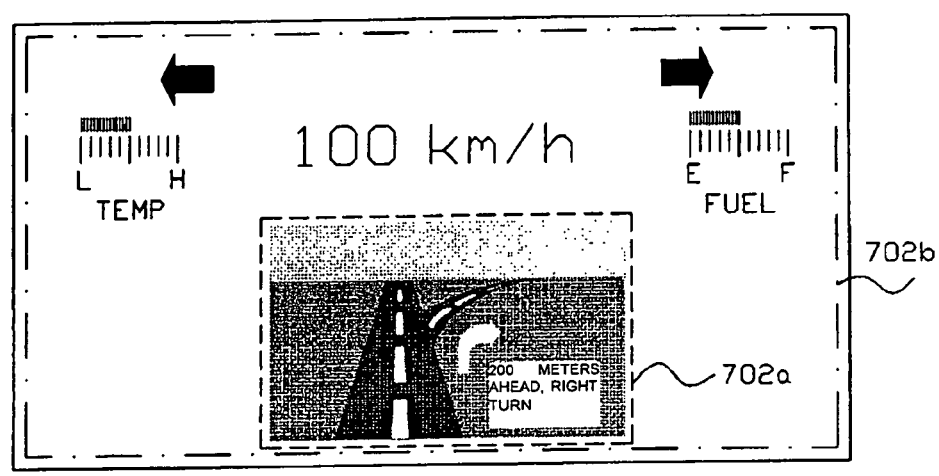
FIG. 13(b) is an explanatory view regarding a structure of an image display region in which the image of FIG. 13(a) is displayed.
Figure 14A:
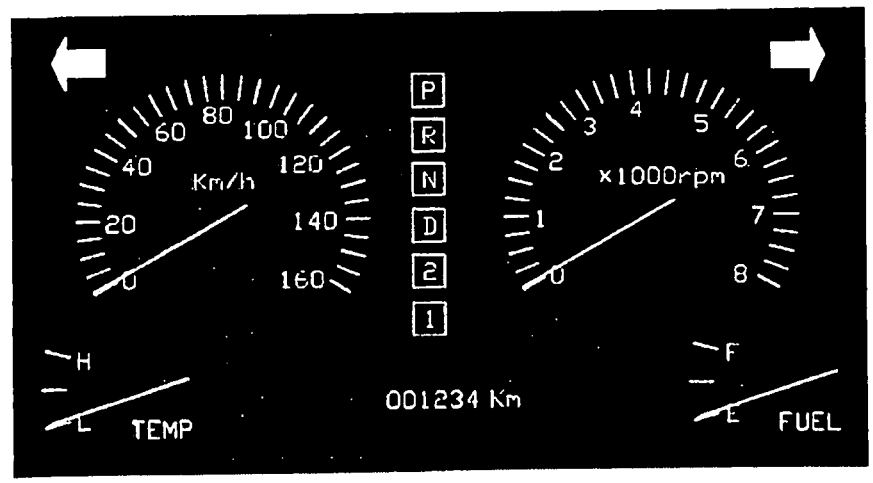
FIG. 14(a) shows still another example of an image to be displayed.
Figure 14B:
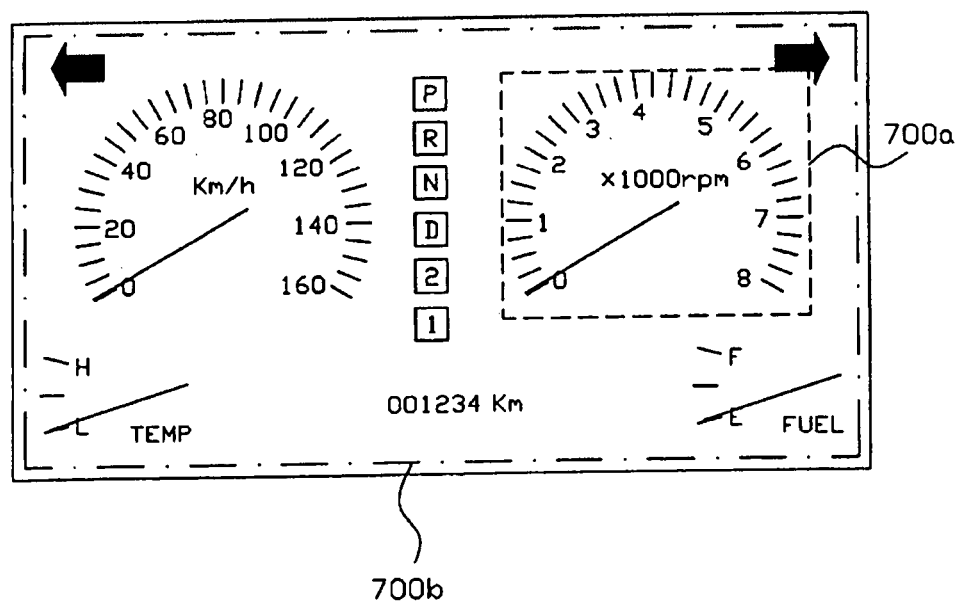
FIG. 14(b) is an explanatory view regarding a structure of an image display region in which the image of FIG. 14(a) is displayed.
Figure 15A:
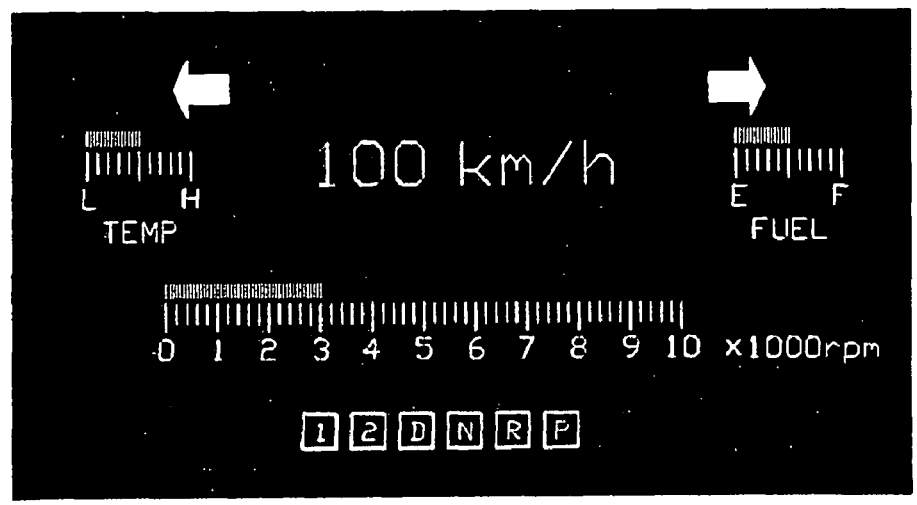
FIG. 15(a) shows a further example of an image to be displayed.
Figure 15B:
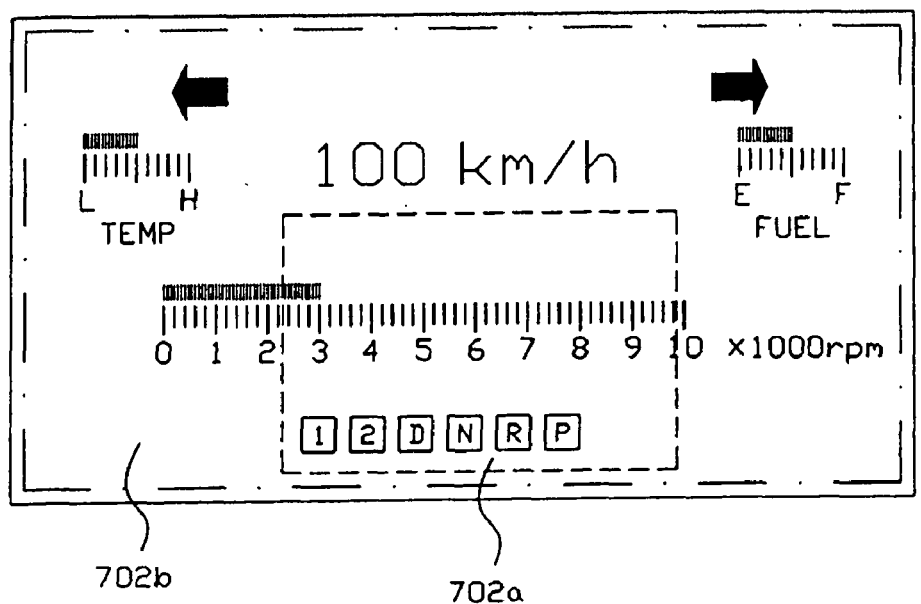
FIG. 15(b) is an explanatory view regarding a structure of an image display region in which the image of FIG. 15(a) is displayed.

Next, the operation of the electro-optical device 1 will be described with reference to FIGS. 1 and 2, and a display example of the electro-optical device 1 will be described with reference to FIGS. 12 to 15. FIG. 12(a) shows an example of an image to be displayed in the image display region 110 of the electro-optical device 1, and FIG. 12(b) is an explanatory view regarding the structure of the image display region 110 in which the image of FIG. 12(a) is displayed. Further, FIG. 13(a) shows another example of an image to be displayed in the image display region 110 of the electro-optical device 1, and FIG. 13(b) is an explanatory view regarding the structure of the image display region 110 in which the image of FIG. 13(a) is displayed. Furthermore, FIG. 14(a) shows still another example of an image to be displayed in the image display region 110 of the electro-optical device 1, and FIG. 14(b) is an explanatory view regarding the structure of the image display region 110 in which the image of FIG. 14(a) is displayed. In addition, FIG. 15(a) shows a further example of an image to be displayed in the image display region 110 of the electro-optical device 1, and FIG. 15(b) is an explanatory view regarding the structure of the image display region 110 in which the image of FIG. 15(a) is displayed.

When the electro-optical device 1 is driven, each of the first pixel portions 70a in the first display region 111a are actively driven, and each of the second pixel portions 70b in the second display region 111b are passively driven.

In FIG. 1, the first image signal is supplied to the first data lines 114a from the first data line driving circuit 150a. Further, if the first scanning signal is written into the first scanning lines 112a from the first scanning line driving circuit 130a to drive the first scanning lines 112a, the switching transistors 76 shown in FIG. 2 are turned on in the first pixel portions 70a. If the switching transistor 76 is turned on, the first image signal is written into the storage capacitor 78 from the first data line 114a. In accordance with the current of the first image signal written into the storage capacitor 78, an electrical connection state of the driving transistor 74 is determined. Then, the current in accordance with the first image signal written into the storage capacitor 78 is supplied from the current supply line 117 to the organic EL element 72 via a channel of the driving transistor 74. The organic EL element 72 emits light in accordance with the supplied current.

Further, in FIG. 1, the second image signal is supplied to the second data lines 114b from the second data line driving circuit 150b. If the second scanning signal is written into the second scanning lines 112b from the second scanning line driving circuit 130b to drive the second scanning lines 112b, the current in accordance with the second image signal is supplied to the organic EL elements 72 which correspond to the second scanning lines 112b and the second data lines 114b to which the second image signal is supplied. The organic EL elements 72 emit light in accordance with the supplied current.

Here, in FIG. 1, the plurality of first pixel portions 70a arranged in the first display region 111a can be preferably provided for any one of red (R), green (G), and blue (B) signals. With such a structure, it is possible to perform a color display in the first display region 111a. Alternately, by turning on one pixel including three first pixel portions of the red (R), green (G), and blue (B) signals as sub-pixels, white or black display may be performed in the first display region 111a. In this case, the first image signal is output from the first data line driving circuit 150a as any one of the red (R), green (G) and blue (B) signals.

Also, the plurality of second pixel portions 70b in the second display region 111b is preferably provided for any one of the red (R), green (G) and blue (B) signals, similar to the first display region 111a. In this case, the second image signal is also output from the second data line driving circuit 150b as any one of the red (R), green (G) and blue (B) signals. With such a structure, it is also possible to perform the color display or the white and black display in the second display region 111b.

In this way, when the first pixel portions 70a in the first display region 111a and the second pixel portions 70b in the second display region 111b are driven, it is possible to display an image as follows.

Referring to FIG. 12(b) corresponding to the image to be displayed shown in FIG. 12(a), an image display for navigation is performed in a first region 700a disposed on the right side, and a display for a vehicle meter is performed in a second region 700b other than the first region 700a. In this case, the image display region 110 consists of the first region 700a, which is the first display region 111a, and the second region 700b, which is the second display region 111b. In other words, in the first region 700a, the plurality of first pixel portions 70a is arranged in a matrix, and in the second region 700b, the plurality of second pixel portions 70b is arranged in the matrix.

Alternately, in the case of displaying an image shown in FIG. 13(a) in the image display region 110, the first display region 111a and the second display region 111b are arranged in the image display region 110 as shown in FIG. 13(b). In other words, referring to FIG. 13(b) corresponding to the image shown in FIG. 13(a), an image display for navigation is performed in a first region 702a disposed on the central lower side, and an image display for a vehicle meter is performed in a second region 702b other than the first region 702a. In this case, in the image display region 110, the first display region 111a is arranged in the first region 702a, and the second display region 111b is arranged in the second region 702b.

In addition, in both the first display region 1a and the second display region 111b, the same display may be performed as follows. FIG. 14(a) shows an image for a vehicle meter. In this case, as shown in FIG. 14(b), a simple display also is performed in the first region 700a shown in FIG. 12(b), similar to the second region 700b.

Further, FIG. 15(a) shows another example of an image to be displayed for a vehicle meter, like the FIG. 14(a). In this case, as shown in FIG. 15(b), a simple display is performed in the first region 702a in FIG. 13(b), similar to the second region 702b.

That is, according to the examples shown in FIGS. 14(a) and 15(a), in both the first display region 111a and the second display region 111b, only a simple display, such as an image display for a vehicle meter, is performed, not an image display, such as a moving picture. Moreover, as shown in FIG. 15(b), it is possible to perform display ranging from the first region 702a to the second region 702b. In this way, when display is performed correlating the first display region 111a, which is the first region 702a, with the second display region 111b, which is the second region 702b, a signal for synchronizing the first scanning line driving circuit 130a and the first data line driving circuit 150a with the second scanning line driving circuit 130b and the second data line driving circuit 150b is preferably supplied to each circuit.

According to the embodiment, it should be understood that an image display is not limited to the examples shown in FIGS. 12 to 15, but an image display, such as a moving picture, may be performed in both the first display region 111a and the second display region 111b.

In this way, the exemplary embodiment makes it possible to design the first display region 111a and the second display region 111b in accordance with display types in the image display region 110 of the electro-optical device 1. Therefore, the first display region 111a or the second display region 111b consuming a relatively large current for performing display may be limited to a necessary and minimum size to optimize the consumption of current in the electro-optical device 1.

Further, by arranging both the plurality of first pixel portions 70a in the first display region 111a and the plurality of second pixel portions 70b in the second display region 111b in a matrix, it is possible to display various images in both the first display region 111a and the second display region 111b.

Therefore, according to the electro-optical device 1 as described above, in the image display region 110, it is possible to perform display on instrument panels designed for various transportation, such as an automobile, an aircraft, and a train.

Modified examples according to the embodiment described above will be described. In the electro-optical device 1 shown in FIG. 1, the image display region 110 may includes the plurality of first pixel portions 70a and the plurality of second pixel portions 70b which are aligned in a matrix arrangement and in a segment arrangement.

In this case, in the image display region 110, the region in which various images including a moving picture are performed are arranged in a matrix, and the region in which the display of a relatively simple image, such as the display of a vehicle meter or the display of time, is performed are disposed in a segment arrangement.

Preferably, the first display region 111a is a matrix arrangement region, similar to the structure shown in FIG. 1. Further, the entire second display region 111b may be a segment arrangement region, or a portion thereof may be a matrix arrangement region.

Figure 16:
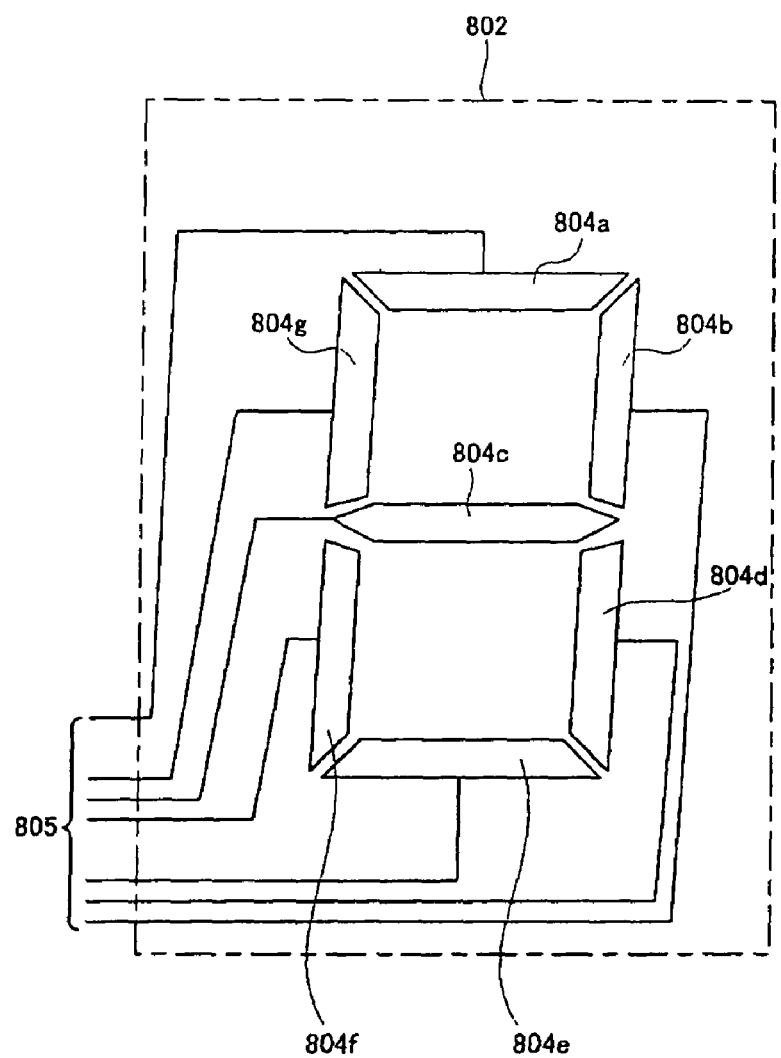
FIG. 16 shows a still further example of an image to be displayed, and is an explanatory view regarding a structure of an image display region in which the image is displayed.

FIG. 16 schematically shows a structure in which the second pixel portions aligned in a segment arrangement.

For example, in the case of displaying '8' by the second pixel portions aligned in a segment arrangement, seven second pixel portions 804a, 804b, 804c, 804d, 804e, 804f, and 804g are arranged at positions for displaying the '8'. In FIG. 16, each of the seven second pixel portions 804a, 804b, 804c, 804d, 804e, 804f, and 804g preferably includes an organic EL element. Then, anodes of the seven organic EL elements are separately provided at positions in which the seven second pixel portions 804a, 804b, 804c, 804d, 804e, 804f, and 804g are arranged. Further, a cathode 802 is preferably provided in common to the seven organic EL elements. In addition, the organic EL layer including the light-emitting layer and the hole injecting layer may be formed in common to the seven organic EL elements.

If the second pixel portions are aligned in the segment arrangement, an external circuit other than the second scanning line driving circuit 130*b* and the second data line driving circuit 150*b* shown in FIG. 1 is used as the second driving device according to the invention. In order to turn on the organic EL elements in the seven second pixel portions 804*a*, 804*b*, 804*c*, 804*d*, 804*e*, 804*f*, and 804*g*, a second driving signal output from the external circuit as the second driving device, which is not shown in FIG. 16, is supplied to a plurality of wiring lines 805.

Next, examples in which the electro-optical device 1 is applied to various electronic apparatuses will be described.

Figure 17:
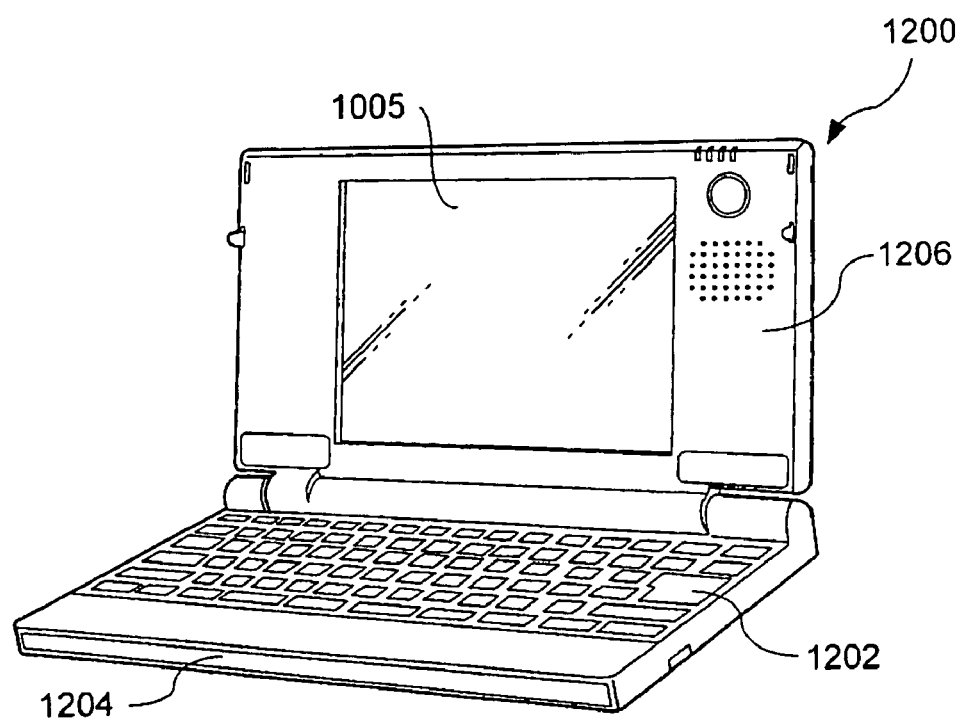
FIG. 17 is a cross-sectional view showing a structure of a personal computer, which is an example of an electronic apparatus to which the electro-optical device is applied.

To begin with, an example in which the electro-optical device is applied to a mobile personal computer will be described. FIG. 17 is a perspective view showing the structure of the personal computer. In the drawing, the computer 1200 can include a main body portion 1204 including a keyboard 1202, and a display unit 1206 consisting of the electro-optical device.

Figure 18:
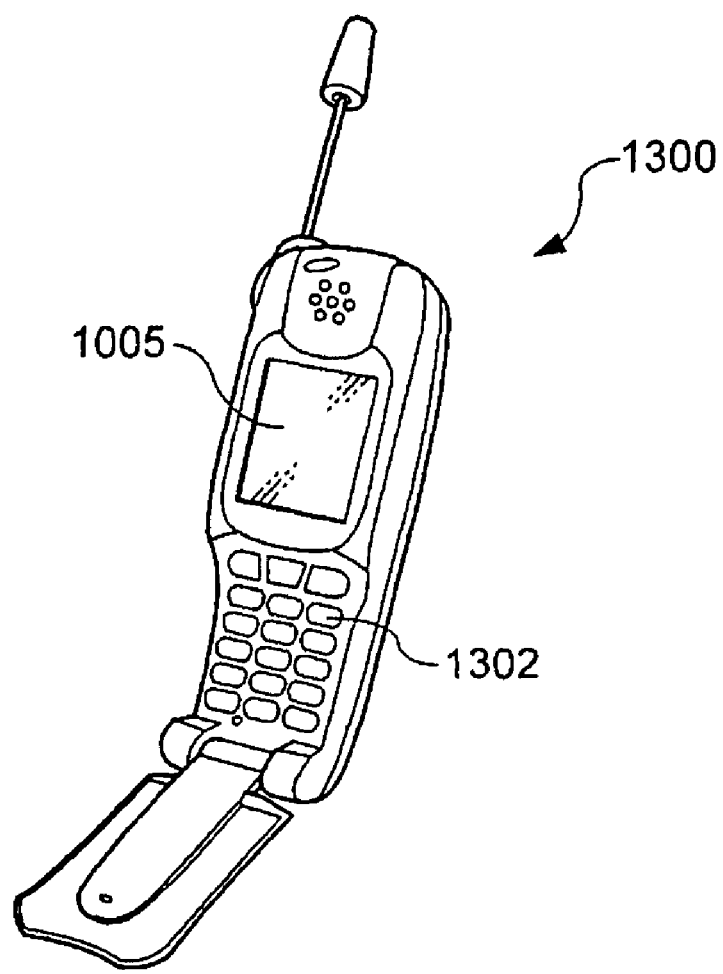
FIG. 18 is a cross-sectional view showing a structure of a cellular phone, which is an example of an electronic apparatus to which the electro-optical device is applied.

In addition, an example in which the electro-optical device is applied to a cellular phone will be described. FIG. 18 is a perspective view showing the structure of the cellular phone. In the drawing, the cellular phone 1300 can include a plurality of operating buttons 1302 and an electro-optical device having an organic EL panel. Moreover, in FIG. 18, the organic EL panel is represented by reference numeral 1005.

Besides, the electro-optical device can be applied to a notebook personal computer, a PDA, a television, a view finder type or monitor-direct-view type videotape recorder, a vehicle navigation device, a pager, an electronic organizer, an electronic calculator, a word processor, a workstation, a POS terminal, and apparatuses equipped with a touch panel.

It should be understood that the invention is not limited to the above-mentioned exemplary embodiments, but may be appropriately modified without departing from the scope or spirit of the invention read from the claims and the specification. Such a modified electro-optical device, a method of manufacturing the same, and various electronic apparatuses comprising the modified electro-optical device will also be included within the technical scope of the invention.

What is claimed is:

1. An electro-optical device, comprising:
   first pixel portions each corresponding to intersection between first data lines and first scanning lines in an image display region on a substrate, and each including an active element and a light-emitting element;
   second pixel portions each corresponding to intersection between second data lines and second scanning lines in the image display region on the substrate, and each including a light-emitting element;
   a first driving device that actively drives the first pixel portions;
   a second driving device that passively drives the second pixel portions; and
   a planarized interlayer insulating film on the first data lines, the first scanning lines, the second data lines and the second scanning lines, the light-emitting elements being provided on the planarized interlayer insulating film.

2. The electro-optical device according to claim 1, both the first pixel portions and the second pixel portions being aligned in a matrix.

3. The electro-optical device according to claim 1, wiring lines corresponding to the first pixel portions and the second pixel portions being provided on the substrate; and each of the first pixel portions having a connecting electrode that electronically couples the corresponding wiring line to the active element.

4. The electro-optical device according to claim 1, in the image display region, image display being performed on a vehicle instrument panel in response to a first driving signal output from the first driving device and a second driving signal output from the second driving device.

5. An electronic apparatus, comprising the electro-optical device according to a claim 1.

* * * * *